(12) United States Patent
Schwartz et al.

(10) Patent No.: US 6,233,548 B1
(45) Date of Patent: May 15, 2001

(54) METHOD AND APPARATUS FOR PERFORMING LEVEL COMPENSATION FOR AN INPUT SIGNAL

(75) Inventors: Stephen R Schwartz; John H. Osmand, both of Providence, RI (US)

(73) Assignee: Stephen R. Schwartz, Providence, RI (US)

( * ) Notice: Subject to any disclaimer, the term of this patent is extended or adjusted under 35 U.S.C. 154(b) by 0 days.

(21) Appl. No.: 09/127,120

(22) Filed: Jul. 29, 1998

(51) Int. Cl.⁷ .................................................. G10L 11/00
(52) U.S. Cl. ............................................. 704/201; 704/270
(58) Field of Search .................................... 704/200, 500, 704/501, 502, 503, 504, 200.1, 220, 201, 507

(56) References Cited

U.S. PATENT DOCUMENTS

| | | | |
|---|---|---|---|
| 3,992,584 | 11/1976 | Dugan | 179/1 |
| 4,357,492 | 11/1982 | Campbell et al. | 179/1 |
| 4,641,361 | 2/1987 | Rosback | 381/103 |
| 4,864,627 | 9/1989 | Dugan | 381/108 |
| 5,046,107 * | 9/1991 | Iwamatsu | 381/107 |
| 5,148,491 | 9/1992 | Sakamoto et al. | 381/119 |
| 5,309,517 | 5/1994 | Barclay | 381/119 |
| 5,666,430 | 9/1997 | Rzeszewski | 381/107 |

FOREIGN PATENT DOCUMENTS 0 682 437 A2 * 5/1995 (EP) .................. H04M/9/08

OTHER PUBLICATIONS

Sonic Foundary, Sound Forge 4.0 User Manuel, Copyright 1991–96, pp. 266–267.

* cited by examiner

*Primary Examiner*—Richemond Dorvil
(74) *Attorney, Agent, or Firm*—Kenyon & Kenyon

(57) ABSTRACT

A method and apparatus for level compensation is presented to compensate for signal level changes made by a signal processor. The original, unprocessed input signal and the output signal from the signal processor (e.g., an equalizer) are provided to a comparison unit which determines a difference in signal level between the two signals. The output of the comparison unit is provided to a level compensator along with the output signal from the signal processor. The level compensator then modifies the signal level of this output signal (e.g., matches it to the original, unprocessed input signal).

18 Claims, 15 Drawing Sheets

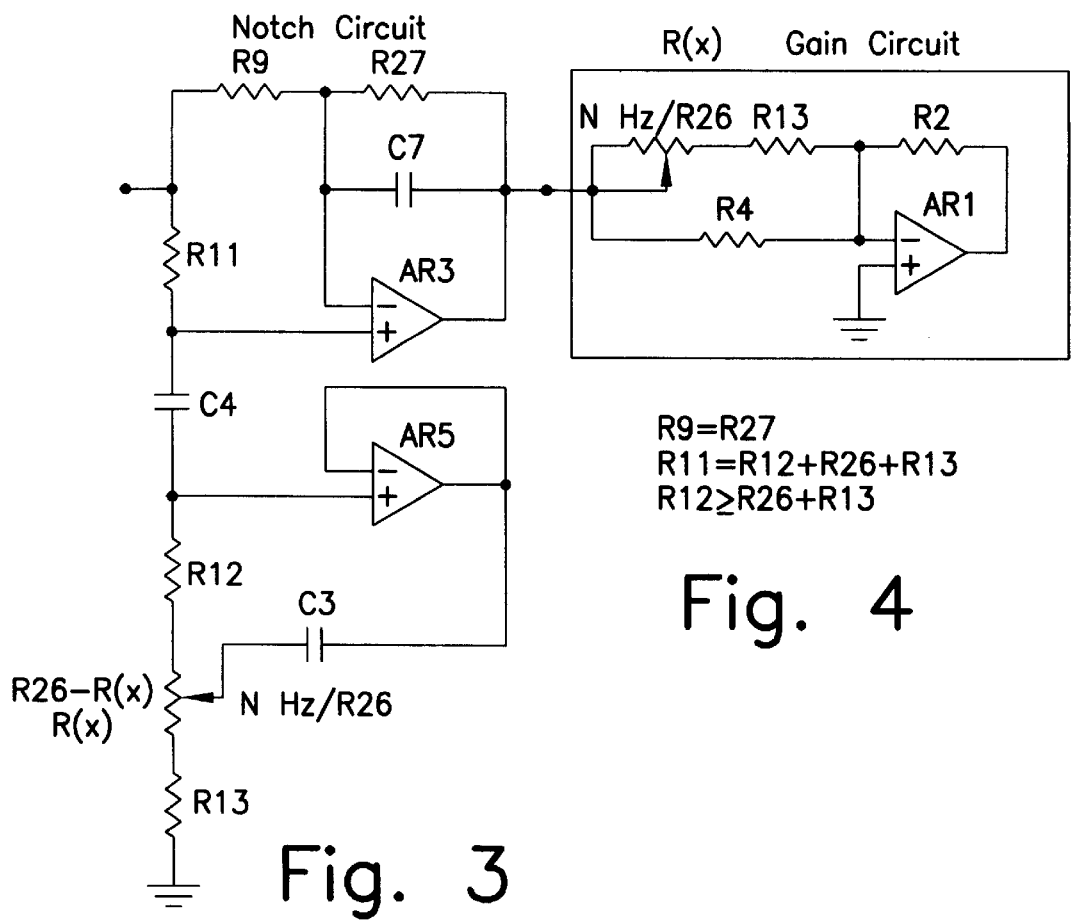
Fig. 3
Fig. 4
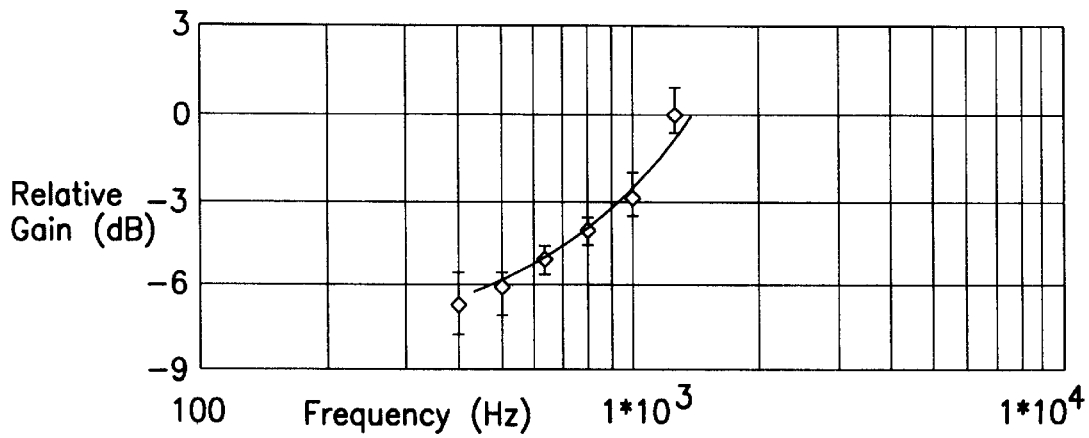
I Gain range from original data (Table 1), normalized.
◇ Gain averaged from original data, $A_x$
Level compensation (gain change), $G(x)$, as result of circuit fig. 4.
Fig. 5

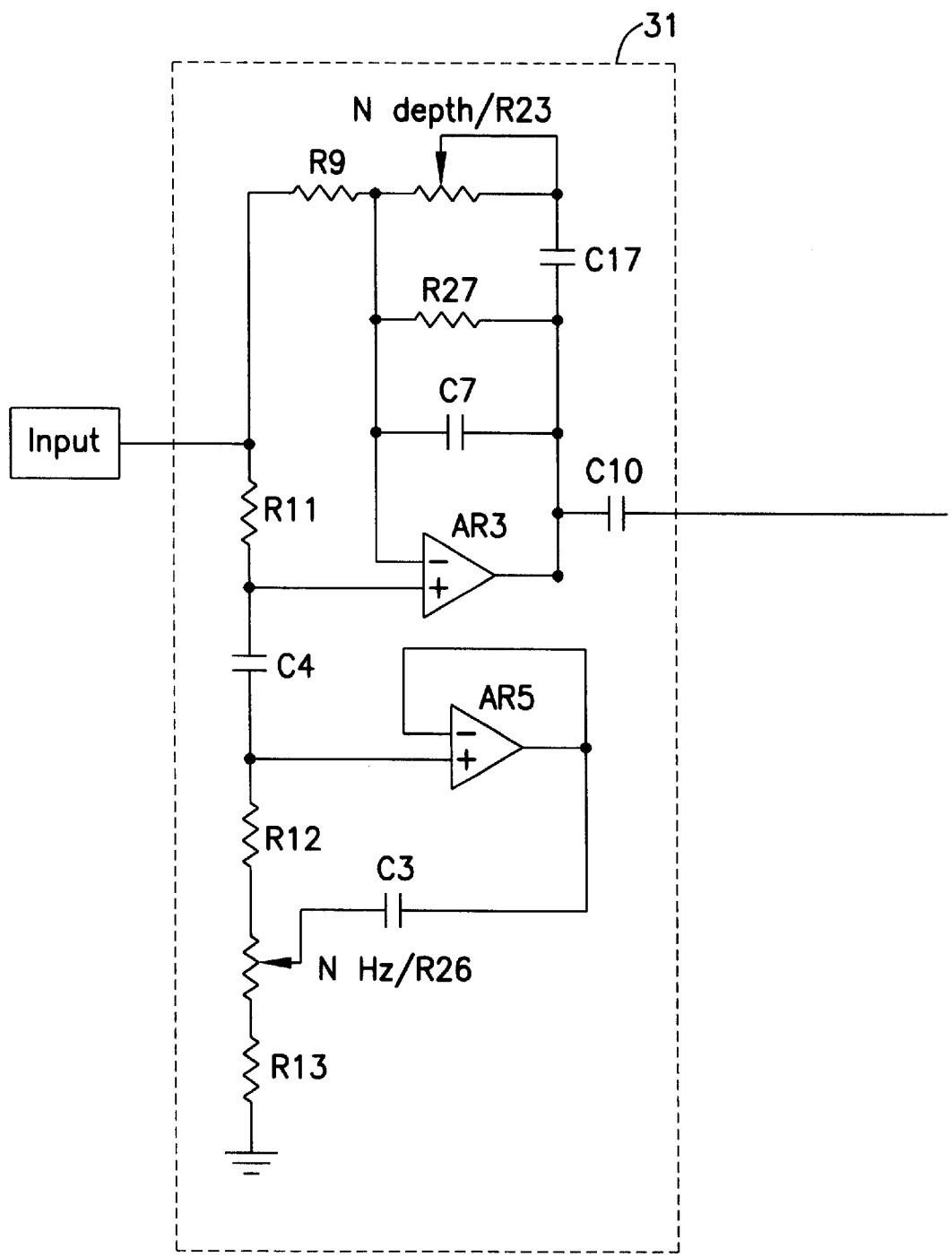
Fig. 5A.1

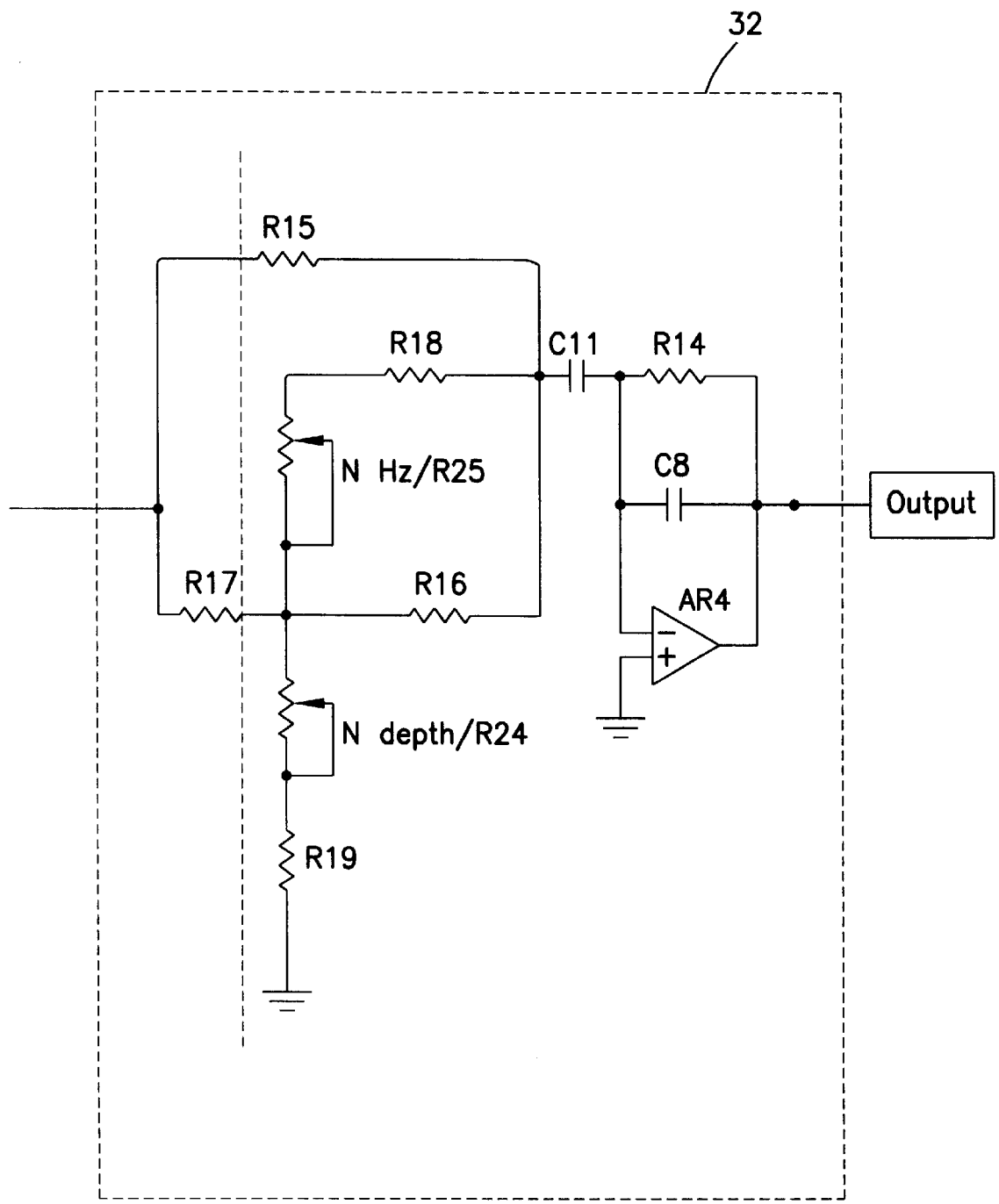
Fig. 5A.2

METHOD AND APPARATUS FOR PERFORMING LEVEL COMPENSATION FOR AN INPUT SIGNAL

BACKGROUND OF THE INVENTION

The present invention pertains to a method and apparatus for performing level compensation for an input signal. More particularly, the present invention pertains to a method and apparatus that adjusts the output level of an input signal to compensate for level changes made to the input signal by a signal processor.

A category of devices referred to as 'signal processors' are known in the art. These processors can be used to modify an input signal, such as music (or other audio sound) that has been converted to electronic analog or digital signals. Common audio processors include tonal modifications (e.g., an equalizer or EQ, vocoders, distortion effects, chorus effects, flanger effects, ring modulators, wah-wah effects), dynamic modifications (compression, expansion, tremelo, vibrato, etc.), reverberation, delay, many others, and combinations of these. Other processors are known in the art such as common video processors (e.g., color filters) and other processors used in a variety of fields. These processors all have a potential "side effect" of changing the original input signal's absolute peak level in relation to other signals or devices present. This change in peak level is usually not desired, is often not readily apparent to an operator, and can easily affect the judgement of an operator of the device, often without the operator knowing it.

In the audio field, there are three common reasons to "equalize" a sound: 1) to get rid of a problem noise (e.g., cut out an annoying air-conditioner buzz), 2) to tailor a pleasant musical sound (e.g., make a singer's voice sound pleasantly 'husky' by adding a certain low range), and 3) to create an effect (e.g., make a singer sound as if singing through a 1920's megaphone, as in the Beatles' "Yellow Submarine").

When using an equalizer to boost or cut a portion of the sound for any purpose, the volume of the sound that is equalized actually gets louder (when boosted) or quieter (when cut). It is also understood in the art of sound engineering that it is important to allow a comparison between the original sound and the equalized sound as part of the process of using an equalizer (or other sound processor). This is accomplished with a "Bypass" switch, which chooses whether the sound goes through the equalizer circuit, or bypasses it.

Psycho-acoustic Concerns and Results: The study of how a person hears is commonly referred to as psychoacoustics. A well-known phenomenon in this field was first codified by Fletcher & Munson, and is most commonly displayed as a graph called the "Fletcher-Munson curves" or "equal loudness contours." The data shows that the human ear-brain system interprets loudness as a function of frequency with two particular effects:

1—A person hears unevenly at different frequencies (at the same volume level, low and high frequency sounds seem quieter than middle frequencies), and 2—As the entire sound gets louder and louder, one will hear more and more evenly. With very loud sounds, the above effect becomes small or disappears. Thus, as one turns up the volume, a person seems to hear more bass and treble, which is why some people listen to music so loudly.

A human being typically is capable of hearing sound in the frequency range that is made by the human voice (from about 100 Hz to 4 kHz) more easily than sounds that are at higher or lower frequencies. A low bass guitar note and a high violin note both need to be played with a lot more energy than a voice, if one wants these instruments to sound as loud as a voice.

The particular effects outlined above interact with one another. As the sound gets louder, frequency differences affect hearing less and less; at very loud levels, it takes about the same amount of energy for the bass, the voice and the violin to sound as loud as each other.

This is commonly experienced when using a stereo. With the volume at a normal listening level, a compact disc will have an acceptable sound. If the volume is turned down a lot, the music will suddenly seem as if there is not enough bass, and also not enough cymbals or other high frequency sounds (the Fletcher-Munson curves describe how much less bass and high frequencies). Stereo systems are often supplied with a "Loudness" control (sometimes an on/off switch, sometimes a variable knob) to try to compensate for this (with very limited success). The Fletcher-Munson curves are averages of data empirically derived from many people, thus they are approximations for any given individual's experience.

Audio engineers deal with this phenomenon on a regular basis. The following are two examples of how this issue is addressed in the art.

A first example involves an instrument that produces only one sound, a tom-tom on a drum set. Given a recording of the tom-tom, the audio engineer is looking to make it sound better using an equalizer. One may hear a pleasant sound near the drum's fundamental resonance, for example between 400–800 Hz. There is also a very unpleasant sound just above this frequency range. An engineer can use a low pass equalizer (which cuts out high frequency signals) that has a control to select frequency (this lets one choose the point above which sound is cut). This should allow the engineer to cut out the unpleasant area and then fine tune the lower frequencies to find a spot where the drum sounds the best.

First, an engineer may cut out the unpleasant frequencies above the nice range. But now, the sound is much too quiet, so the volume is turned up significantly. Next, the engineer fine tunes for the nicest sound. The drum itself has varying degrees of loudness at each frequency, and the nicest place to set the control may be in a frequency range where the drum is relatively quiet. If the nicest part of the drum's sound is very quiet, it may go unnoticed (again because of the Fletcher-Munson effect). From experience or training, the engineer will (again) turn the volume up significantly, to help hear the best sound. Next, a bypass switch is used to see if the equalized signal is an improvement over the original (unequalized) sound. The much louder unequalized sound makes it impossible to tell what the engineer has accomplished (the louder one almost always sounds fuller and better just because it is louder, as described by the Fletcher-Munson curves) and can hurt ones ears because the sound is so much louder (the equalized sound had to be turned up a lot so that one could hear it). This increased volume could also damage the speakers because the sound is so much louder.

In a second example, the recorded track of a singer is mixed with the rest of the band (drums, bass, guitar, piano, etc.). As stated above, the music sounds "bassier" when the volume is turned up (or less "bassy" when the volume is turned down), as described by the Fletcher-Munson curves. As more bass is added to a sound with an equalizer, the total volume is being increased.

If the recording of the voice sounds "thin" because the microphone was poorly placed, the engineer may try to compensate by turning up the bass equalizer. The voice sound improves, but the extra bass has made the voice louder than the rest of the band, so it is turned down to an appropriate level. The result is that, the voice doesn't have enough bass anymore (due to the Fletcher-Munson effect). So the process is repeated a few times, until a satisfactory result is achieved.

A known technique for solving the problems addressed above is set forth in the following complex procedure.

1—Select a channel to be equalized ("EQ Ch.").
2—Set up a separate channel that duplicates the unequalized original input ("UNeq Ch").
3—Listen only to the EQ Ch. (i.e. 'SOLO' the EQ Ch.—listening only to that channel, turning off all other channels).
4—Adjust the equalizer settings on the EQ Ch. until satisfactory.
5—Solo the EQ Ch. and the UNeq Ch. back and forth to:
   a—match the EQ Ch.'s output level to the UNeq Ch.'s output.
   b—adjust the equalizer settings on the EQ Ch. if necessary.
6—In the mix (with the other sound channels turned back on),
   a—Set (one at a time) both the EQ Ch. and UNeq Ch. levels
   b—compare the EQ Ch. and UNeq Ch. to judge and adjust the equalizer settings.
7—Adjust as necessary, repeating steps 3–6 as needed.

Not only is the foregoing solution complex, but many musicians and many sound technicians do not understand or know of this problem nor how to compensate for it. This is evidenced by the amplified sound in many clubs, concerts, weddings, etc. which is often poor (e.g., harsh, piercing, boomy, too loud, etc.).

In the art, there are two very common devices that actually change the source material volume (other than equalizers, reverberators, and other processors). These devices make no moment-to-moment changes that affect the signal.

1—The Loudness Control (a switch or knob found on many consumer listening devices) is an attempt to compensate for the Fletcher-Munson effect at low listening levels. It is a special tone control that boosts both the bass and treble with one control (but the bass and treble it turns up are somewhat different from typical bass and treble controls).

2—AGC (Automatic Gain Control) amplifier circuits are used to compress (make smaller) a signal's dynamic range. This means that, no matter how loud or soft the original sound (the input) is, the output is always at the same volume. It is usually found on consumer items with low quality built in microphones (VCR's and inexpensive cassette tape recorders) and on devices that intentionally sacrifice sound quality for speech clarity (CB and Ham radios, some telephones). The output is not dependent on either the sound source or any particular setting. Audio fidelity is intentionally sacrificed to overcome the limitations of noisy environments, or to allow the use of cheap devices. In fact, these usually don't even have an input volume control, although some higher quality products allow a choice between using the AGC circuit and a real input level control circuit. These have an on/off switch for the AGC circuit; AGC ON bypasses the real input circuit, AGC OFF bypasses the AGC circuit.

Related to the AGC are dynamic processors in general. These are professional devices that allow the user to control how the dynamic range reduction happens. As with the AGC, these devices make actual changes to the dynamic range of the input signal.

In view of the above, there is a need for a method and apparatus that can make intelligent corrections in level to compensate for changes in level caused by a processor and allows the user to make better choices about the use of the processors without having to do, or even understand the need for, the compensation.

SUMMARY OF THE INVENTION

These and other needs are met by a method and apparatus of the present invention. According to an embodiment of the present invention, intelligent corrections in the level of an output signal can be made to compensate for changes in peak level.

In a first embodiment of the present invention, the unprocessed source signal is first compared to the final processed signal to determine an amount of change, and then uses that comparison to make a level adjustment. Standard components can be used to build a stand-alone device that:

1—compares the pre-processor signal (original unprocessed signal) with the post-processor signal (after it has been processed),
2—notes the difference in level between them, and then
3—compensates the processed signal, for example, by matching the post-processor signal level to the pre-processor signal level.

In this embodiment, one objective is to effect a single overall level change, and since any number of processors in combination result in only one final level change, this circuit will work for any combination of changes. Therefore, only one circuit is needed for a given signal path, regardless of how many processors are between the "pre-" and "post-" reading points.

Alternatively, the processed signal is provided to a level compensation device, and the output of the level compensation device and the unprocessed signal are provided as inputs to a comparison device. The output of the comparison device then provides a feedback signal to the level compensation device. Accordingly, the level compensation device modifies the level of the processed signal, until the output of the level compensation device has a level equal to the level of the unprocessed signal.

In a second embodiment of the present invention, the compensation that is provided to the processed signal is empirically derived rather than by direct measurement. Actual level changes that result from an operator's use of a given processor controls are measured. Each control on the processor which 'causes' an undesired level change can also be used to control a circuit that provides level compensation by producing a desired opposing level change. This embodiment is well suited to a situation where one knows the range of variation in the character of the signal to be processed, and knows the range of variation in the settings of the processor's control. According to this embodiment of the present invention, development of compensation for a single control on a processor includes the following steps:

1 Adjusting the processor's control in adequately small steps (e.g., 30 degrees of rotation for a rotary knob) while listening normally and observing a representative signal source.
2 For each position of the control, the resulting change in overall signal level is noted (with objective measurement and/or with an experienced observer matching perceived levels).

3 Repeat with an adequate variety of source materials.
4 Compile the results, and design a circuit that counteracts the level changes caused by the changes of the processor control. The circuit is to be adjusted by the same control that adjusts the processor parameter. Two implementations of this, using a standard potentiometer as the control, are:
  a. Have a separate gain circuit in series with the processor, whose gain is adjusted, e.g., by a separate potentiometer element on the same shaft as the processor control.
  b. Modify the processor to incorporate the desired changes in gain.

The ability to specifically tailor the compensation for a specific situation and/or use is a particular advantage of this method. Another is that it can require a minimum of circuitry to accomplish (thus, can be expensive).

In a third embodiment of the present invention, a method is provided to compensate for level changes, for example, where the processor itself makes dynamic changes in level, as do compressors, expanders, and the like. While it is desirable for these to change the dynamic range of the source material, it is usually not desirable for these devices to change the peak level (loudest spots) relative to the rest of the acoustic environment.

In audio, these devices generally work by comparing the level of the input signal to a threshold, which is a constant reference voltage whose level is set by the user with a control. When the signal source crosses the set threshold level, the signal is processed, most often via a single control that sets (e.g.) the ratio of processing applied. At any given setting of these two controls, the total effect on the signal's peak (loudest moment) is a simple function of its difference from the threshold times the ratio setting, in decibels. This function is often represented as a Control Voltage, which is then commonly applied to a device such as a VCA (voltage controlled amplifier) which continuously enacts the desired changes in level.

An embodiment of this method uses the same control settings for the processor's effect to manipulate a second control signal path, which uses a separate constant reference voltage as an input. The first control signal responds to the audio input signal. The second control voltage is dependent on the processor's control knobs, but not the input signal, creating the desired fixed level compensation. This compensation control voltage may be applied to the same device (e.g. VCA) that is used by the processor. Also, because the amount of level compensation is determined by the same controls which set the changes in peak level output, the amount of level compensation will automatically track (and accurately compensate for) changes in the processor's settings. The result is an integrated processor and level compensation system.

BRIEF DESCRIPTION OF THE DRAWINGS

FIG. 3 is a detailed circuit diagram of the processor of FIG. 2.

FIG. 4 is a detailed circuit diagram of the amplifier of FIG. 2.

FIG. 5 is a graph showing the relationship between frequency and level compensation in an example of the operation of the circuits of FIGS. 2–4.

FIG. 5A is shows a notch filter with interactive depth and frequency level compensation constructed according to an embodiment of the present invention.

DETAILED DESCRIPTION

Figure 1:
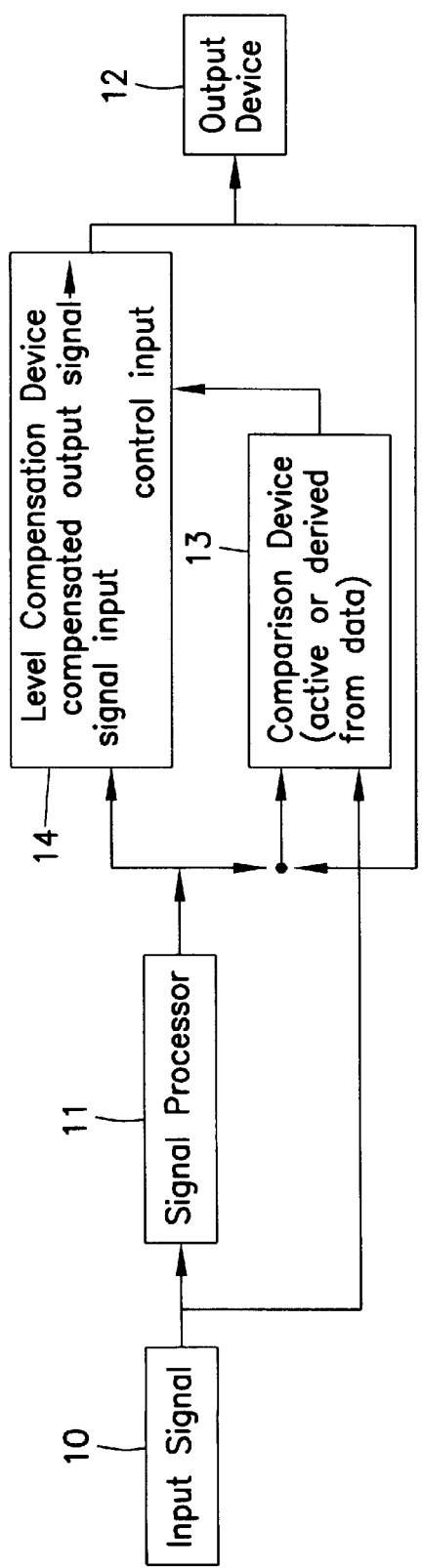
FIG. 1 is a general block diagram of an apparatus constructed according to an embodiment of the present invention.

Referring to FIG. 1, a block diagram of an apparatus for performing level compensation according to an embodiment of the present invention is shown. The level compensation can be referred to as performing one of the following steps:

1. When the processor reduces the overall level of the input signal, the apparatus of the present invention provides an increase in gain to match the original signal level.

2. When the processor increases the overall level of the input signal, the apparatus of the present invention provides a decrease in gain to match the original signal level. This allows a user to make judgments about a processor's effect without being "fooled" by the differences in signal level. It can do so without involving the user at all (which can be a tedious process as described above). A switch can be made available to disable the circuit if desired. As described in the embodiments below, the present invention can be applied to compensate volume for audio signals. One skilled in the art will appreciate that the present invention (e.g., the circuit of FIG. 1) can be applied to compensate for level changes caused by a processor of other types of signals (e.g., video signals, MRI's, CAT scans).

Referring to FIG. 1, an input signal 10 is provided to a processor 11 (e.g., a digital signal processor) where the signal is modified. For example, the signal can be modified by the processor by decreasing the level of a particular frequency band of the signal (e.g., as in an audio filter). The original, unprocessed signal and the modified signal from the processor can be supplied to a comparison device 13 (i.e., the modified signal may be supplied either before or after level compensation device 14). The comparison device 13 outputs a difference signal indicating the difference in level between the original signal and the modified signal. The level compensation circuit 14 receives the modified signal and the difference signal and level compensates the modified signal (e.g., corrects the increase or decrease in gain caused by the processor 11). If desired, the level compensated signal can be provided to an output device 12, such as a recording device, a speaker, etc.

As indicated above, an example of a processor is one that changes tone quality, such as an equalizer. Tone quality, also called timbre, is a result of the balance of different frequencies, measured in Hertz (cycles per second). A human's hearing is limited to a range between 20 Hz and 20 KHz (20,000 Hz), sometimes called the sound spectrum. Equalizers, tone controls, filters, etc. are devices which change tone quality. They all work by allowing either an increase or a decrease in the volume of a selected portion of the hearable frequency range. A device that raises or lowers the entire frequency range evenly is simply a volume control. An equalizer works as a volume control for a limited portion of the hearing range.

Figure 9:
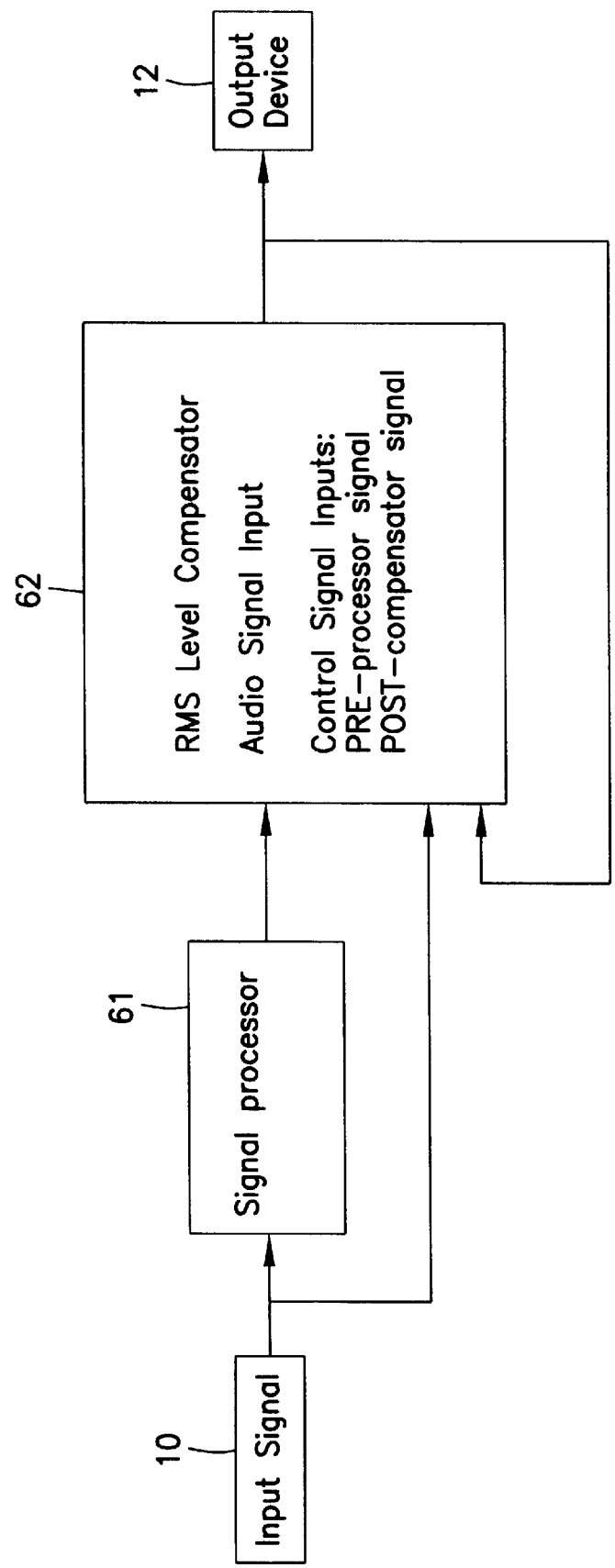
FIG. 9 is a block diagram of an apparatus constructed according to a first embodiment of the present invention.
Figure 10:
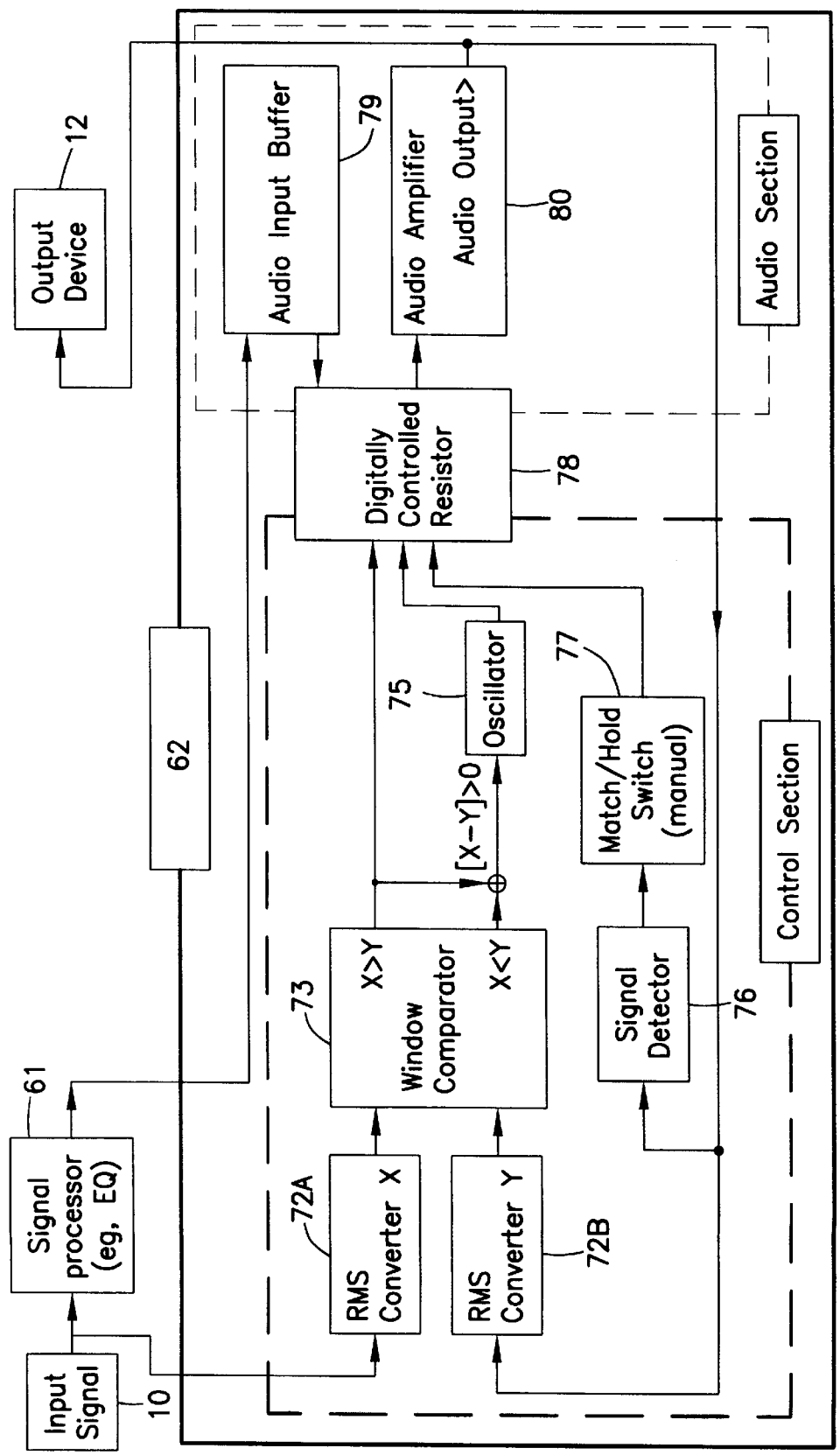
FIG. 10 is a detailed example of the apparatus of FIG. 9.

A first embodiment of the present invention is shown with respect to FIGS. 9–12. Referring to FIG. 9, a block diagram of this embodiment is shown. In FIG. 10, a more detailed example of the circuit is shown (i.e., a Root-Mean-Square (RMS) Level Compensation System). In FIG. 9, three signals are input to an RMS level compensator 62: a post processed signal ("Audio Signal") from signal processor 61, a pre-equalized "control" signal 10, and a post-compensator "control" input from said RMS level compensator 62. The RMS level of the input signal and the control signal are measured by RMS converter 72A and RMS converter 72B (FIG. 10), respectively, and compared (e.g., in a window comparator 73). If the control signal is greater than the output signal, then the signal processor 61 is reducing the level of the signal at that moment, so the compensator's gain is increased by adjusting a digitally controlled resistor 78. If the control signal is less, the gain is reduced. The rate of change in gain is determined by the frequency of the oscillator 75 and by the resolution of the resistor. The gain will change until the output level matches the control signal level, or until the gain limits are reached. If there is no output signal detected as sensed by signal detector 76 or if the operation mode is on "Hold," (as determined by Match/Hold Switch 77), the resistor will not change value, and the gain remains the same.

Figure 11:
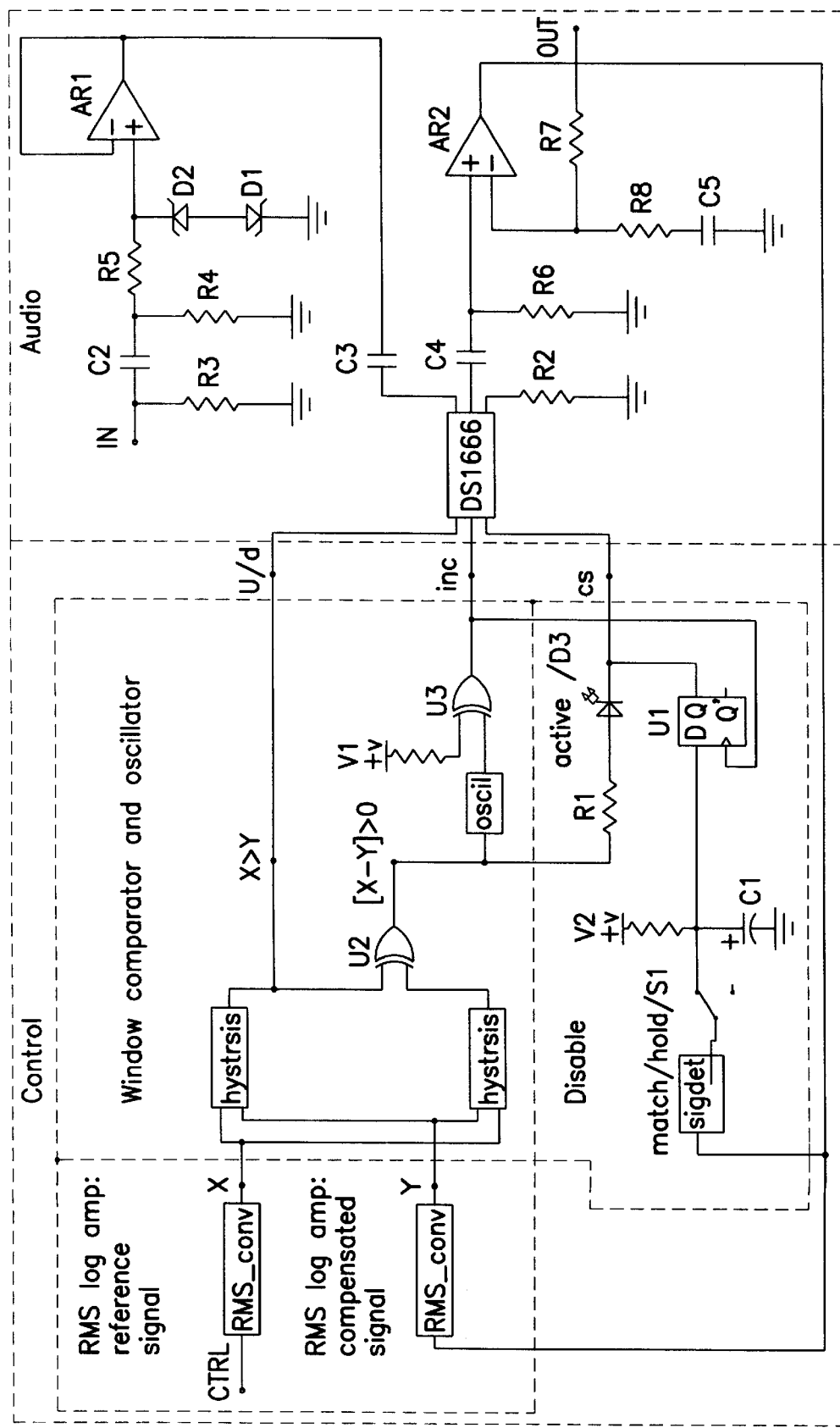
FIG. 11 is a further detailed circuit diagram of several elements of FIG. 10.

Referring to FIG. 11, a more detailed schematic of the circuit of FIG. 10 is shown where the block designated DS1666 is functioning as a digitally controlled attenuator, range limited by resistor R2, with output gain stage at op-amp AR2 to allow boosting of the audio signal. The control inputs to the DS1666, UP/down, increment, and chip select, are operated by "Window comparator," "oscillator," and "disable" circuits, respectively. "RMS_conv" converts the "CTRL" signal and the "OUT" signal into RMS log-equivalent signals. "Hysteresis" circuits determine whether "CTRL" is significantly greater or less than "OUT." If there is a significant difference, "oscil" increments DS1666 up or down. The direction is determined by the top "hysteresis" circuit output. XOR gate U3 provides necessary timing of the chip select input with the increment input.

Figure 12:
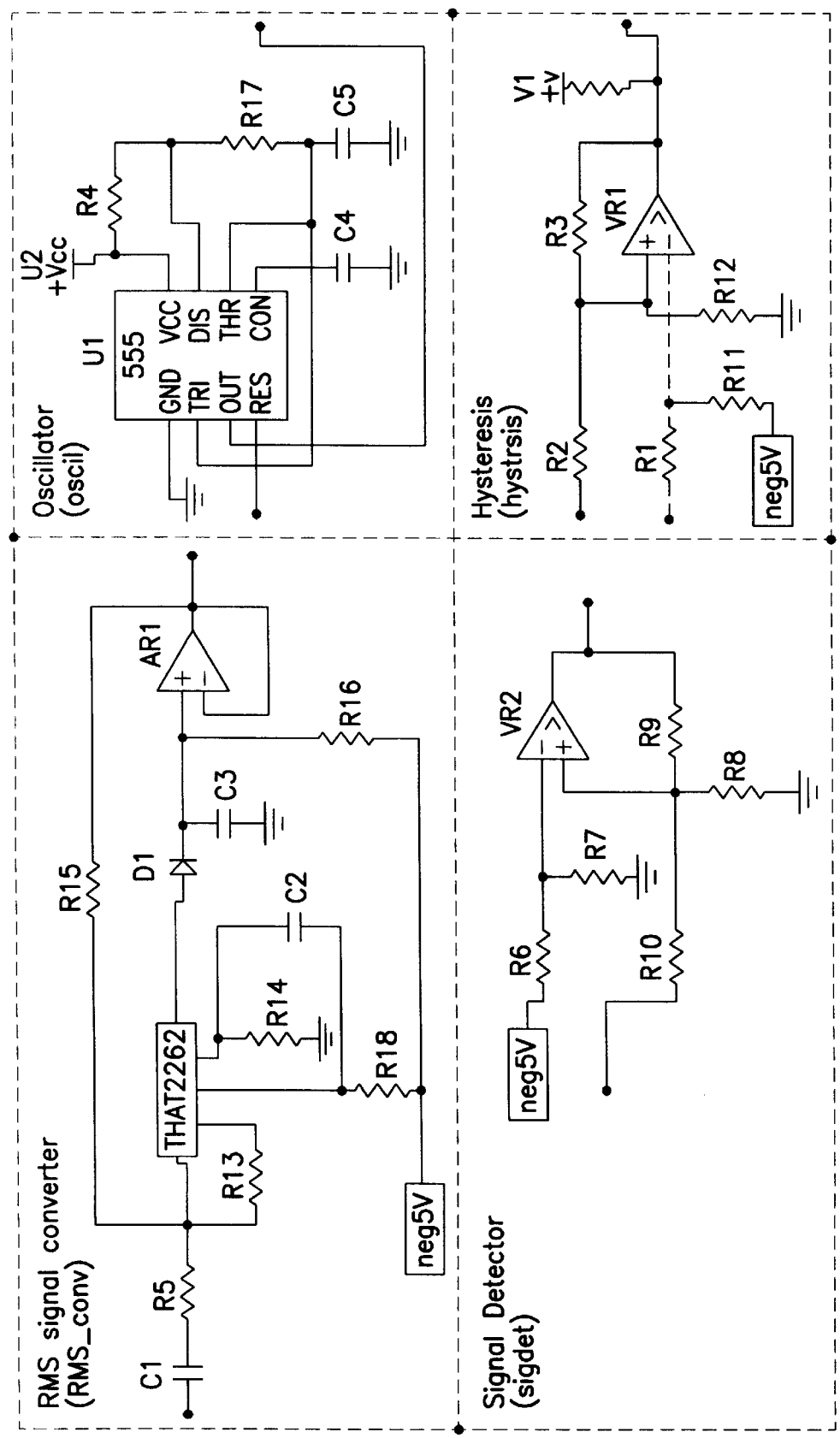
FIG. 12 is a further detailed circuit diagram of several elements of FIG. 11.

Referring to FIG. 12, a schematic of the subcircuits of FIG. 11 is shown. The RMS conversion is accomplished with a THAT2252 log converter and rectification (by diode D1 and capacitor C3). Resistor R16 provides independent release time by discharging capacitor C3. The oscillator is a standard 555 Timer circuit activated by the Reset pin. Note that the comparators VR1 in the hysteresis blocks have a degree of hysteresis to allow approximate level match, for instance, to within ±2 dB. The signal detection VR2 responds to a negative going AC signal crossing below a preset noise threshold. This functions as a safety feature that prevents the compensation circuit from responding to inappropriate signals accidentally, especially during the release time of the RMS converters.

A potentially more accurate version of this embodiment of the present invention uses the same steps as above, but the comparison includes an analysis of the frequency spectrum of the pre-processed and post processed signals. The applied level compensation is based upon the signal level differences and the frequencies at which the level differences occur. For example, a Fast Fourier Transform (FFT) could be used, but other frequency band examination techniques are possible. An example of this procedure is given below:

1—FFT's are taken of the pre-processed signal and the post processed signal.
2—The RMS value of both for selected bandwidths is derived. ⅓ octave is common in general audio work, which results in about 30 bands of calculation for each of the 2 FFT's. Fewer bands may be satisfactory, especially if carefully determined.
3—"Weigh" the results of step 2 with an "average" Fletcher-Munson curve.
4—Sum the results of step 3 into pre-processed and post-processed subtotals.
5—Take the difference between the step 4 subtotals (subtract one from the other).
6—Adjust the final output level according to the results in step 5.

A goal of this embodiment of the invention is a single overall level change, and since any number of processors in combination result in only one final level change, this circuit will work for any combination of changes. Therefore, only one circuit is needed for a given signal path, regardless of how many processors are between the "pre-" and "post-" reading points.

Figure 2:
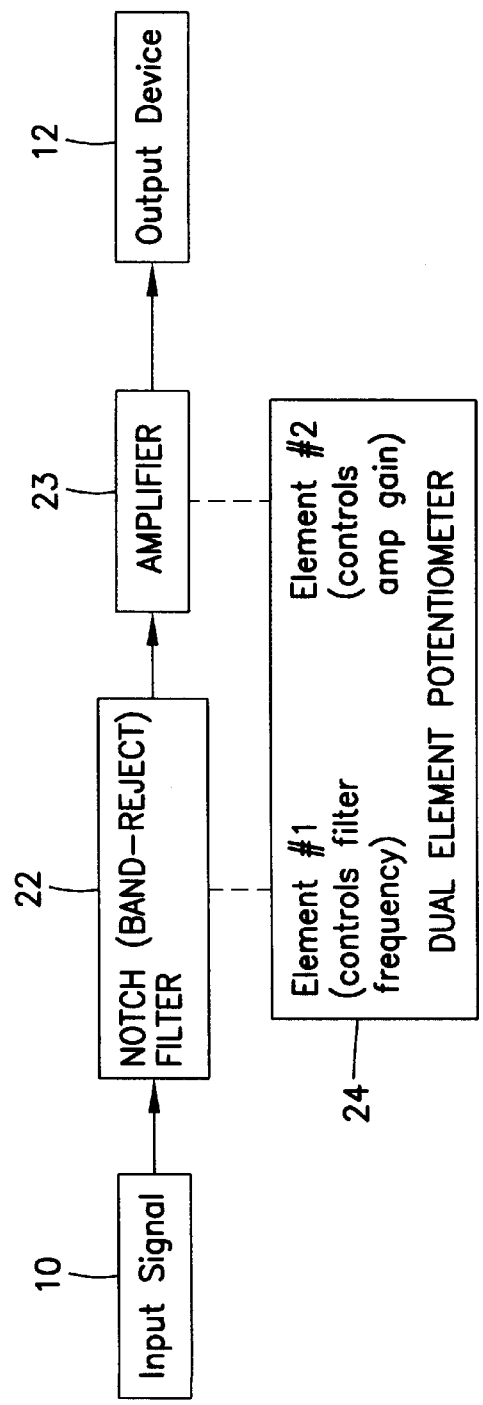
FIG. 2 is a general block diagram of a second embodiment of the present invention.

A second embodiment of the present invention is shown in FIGS. 2–8 where the level compensation is empirically derived. Deriving an integrated level compensation for an audio signal processor depends on an assumption of the character of the signal to be processed and level compensated. That is, one must assume a change in setting of the processor will effect the level similarly because all expected input signals would be similar. For instance, a notch filter can be used to modify the sound of a cymbal, and setting the notch frequency at 400 Hz may increase the auditory level by 6 dB above a setting of 1.25 kHz for most cymbals. To maintain equal level, the gain must be compensated by −6 dB for a change in frequency setting of 400 Hz to 1.25 kHz. Referring to FIG. 2, a broad view of how frequency and gain may be tracked via a dual potentiometer 24 is shown.

An example of the method of this embodiment is given below:

1 Select the processor desired. In this example it is a notch filter (as shown in FIG. 3) with variable frequency (400 to 1250 Hz) and fixed depth.
2 Select a typical sound source, e.g., a cymbal being hit. Set a starting parameter and output level, for example with the notch frequency at 1.25 kHz and the output gain referenced to 0 dB.
3 Change a parameter by a chosen increment and adjust gain to match previous level, if necessary. The new parameter setting and new gain setting are recorded. Repeat over entire useful range of the variable parameter. For instance, as shown in Table 1, row 1 shows the relative gain changes needed to maintain equal level of cymbal sound at one-third octave intervals from 400 Hz to 1.25 kHz.

TABLE 1

$$H = \text{Gain change for} \begin{matrix} \text{cymbal\#1} \\ \text{cymbal\#2} \\ \#3 \\ \#4 \\ \#5 \\ \#6 \\ \#7 \\ \#8 \\ \#9 \\ \#10 \end{matrix} \begin{bmatrix} -8 & -6.5 & -5 & -4 & -3 & 0 \\ -7 & -6.5 & -5 & -4 & -3 & 0 \\ -6.5 & -5 & -4 & -3 & -2.5 & 0 \\ -8 & -8 & -6.5 & -5 & -3 & 0 \\ -6 & -6 & -5 & -4 & -3 & 0 \\ -6.5 & -6 & -5 & -4 & -2.5 & 0 \\ -5 & -5 & -4.5 & -4 & -3 & 0 \\ -7 & -6 & -5 & -4.5 & -3 & 0 \\ -6 & -5.5 & -5 & -4 & -3 & 0 \\ -7 & -6 & -5 & -4 & -3 & 0 \end{bmatrix}$$

← These gain settings in dB, relative to gain at 1250 Hz = 0 dB.

F in Hz: 400 500 630 800 1k 1.25k (F = Notch frequency setting)

H = Relative dB gain needed based on subjective comparison at six one-third octave notch frequency settings (F) using ten similar sound sources through FIG. 3 Notch circuit (e.g., 10 cymbals).

4 Repeat steps 2 and 3 for many similar sound sources. Table 1 is data from 10 similar cymbals.

5 Determine an average relative gain desired at each increment of the parameter. Using Equation 1, the mean of each column of Table 1 can be computed. It also may be helpful to calculate the range of gain at each frequency. Equation 2 first adjusts the relative gain data to center around a total average point, optimizing the deviation. Equations 3 and 4 calculate the maxima and minima of the adjusted columns. The results are shown in FIG. 5.

$$A_x = \text{mean}(H^{<x>}) \quad \text{Eq. 1}$$

$$H^{<x>} = H^{<x>} + Q \text{ where } Q = [0.3, 0.133, -0.617, 0.967, -0.117, -0.117, -0.533, 0.133, -0.2, 0.05] \quad \text{Eq. 2}$$

$$L_x = \max(H^{<x>}) \quad \text{Eq. 3}$$

$$S_x = \min(H^{<x>}) \quad \text{Eq. 4}$$

6 In the analog circuit of this example, the frequency settings must correlate to gain settings via the potentiometer. Using a duel potentiometer, for instance, allows the addition of a gain circuit (FIG. 4) so that gain and frequency are controlled simultaneously from a single knob. Equations 5 and 6 describe the relationships between notch frequency, gain, and resistance (f(x), G(x), and R(x)), in this example. Results are shown in Table 2.

$$f(x) = \frac{1}{2 \cdot \pi \cdot \sqrt{C3 \cdot C4 \cdot (R(x) + R13) \cdot (R12 + R26 - R(x))}} \quad \text{Eq. 5}$$

$$g(x) = -\left[\frac{R2}{(R(x) + R13)} + \frac{R2}{R4}\right] \quad \text{Eq. 6}$$

TABLE 2

| $F_x$ | $G(x)$ | $A_x$ |
|---|---|---|
| 400 | −6.354 | −6.7 |
| 500 | −5.758 | −6.05 |
| 630 | −4.999 | −5 |
| 800 | −3.951 | −4.05 |
| 1000 | −2.521 | −2.9 |
| 1250 | −0.651 | 0 |

In Formula 6, the value of resistor R4 determines the shape of the curve shown in FIG. 5.

Find the closest match of the gain settings with the frequency settings. Since the frequency circuit has been predetermined as the functionally best arrangement, the gain circuit must be adjusted to match it. By choosing resistance value R4 appropriately, the resultant change in gain as seen by the line in FIG. 5 can approximate the desired change in gain with respect to frequency as shown by the diamonds in FIG. 5. Resistor R2 sets the overall gain.

8 Repeat for other parameters.

Figure 8:
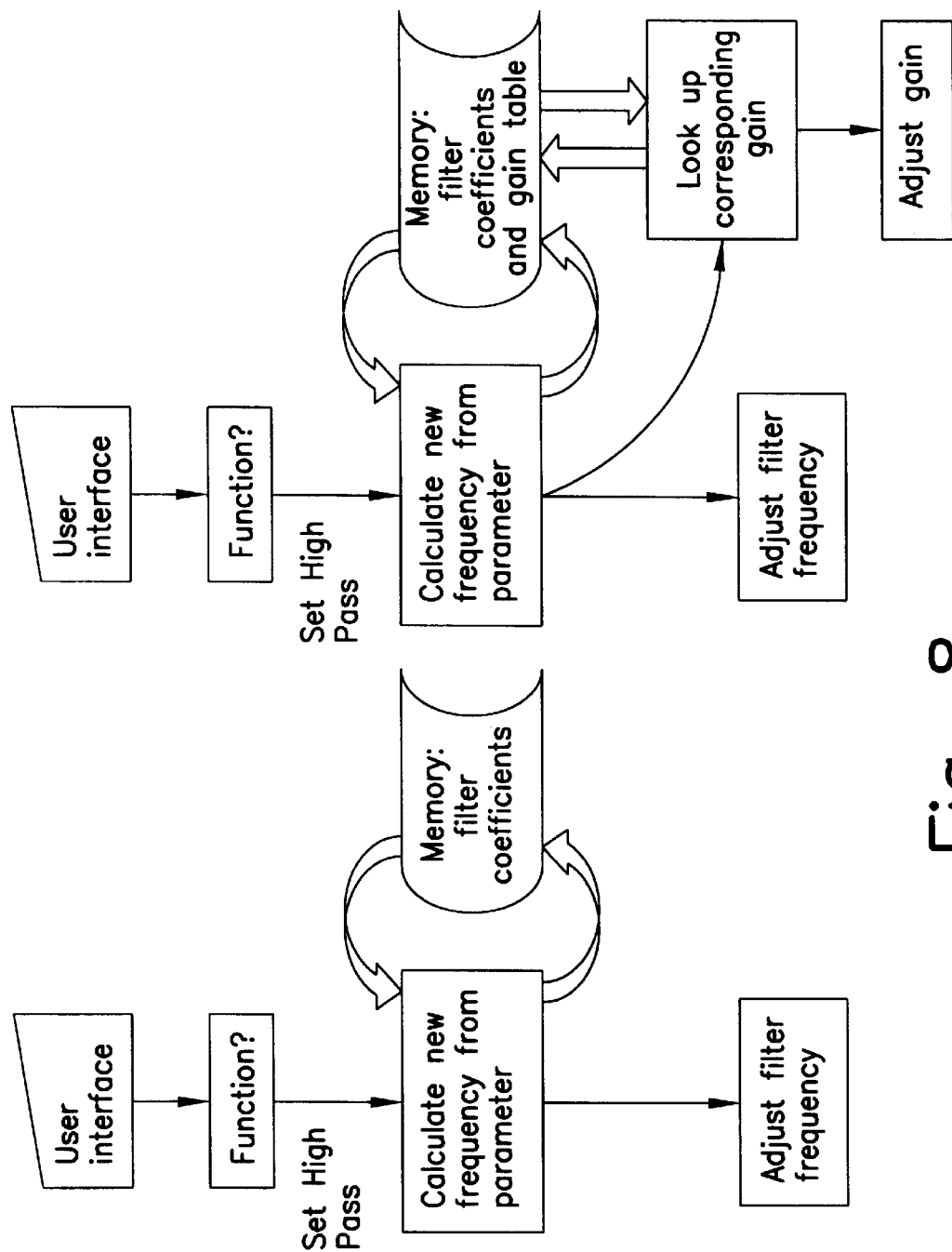
FIG. 8 is a block diagram of a digital level compensation system constructed according to an embodiment of the present invention.

Alternatives to the example method in step 6 include integrated gain change with frequency change by manipulating the filter circuit (see FIG. 5A, also FIG. 6 and 7) and a digital version (see FIG. 8). One variation of a digital version has the average gain data stored in memory, interpolating gain at frequencies between measurement points; another variation calculates gain using the relationship between f(x) and G(x).

FIG. 5A shows a notch filter with interactive depth and frequency level compensation. The gain transfer function for audio frequencies is given by Equation 7.

$$\frac{R14 \cdot (R24 + R19) \cdot (R25 + R18 + R16)}{(R16 \cdot (R24 + R19) + R17 \cdot (R16 + R24 + R19)) \cdot (R25 + R18) + R17 \cdot R16 \cdot (R24 + R19)} + \frac{R14}{R15} \quad \text{Eq. 7}$$

Figure 6:
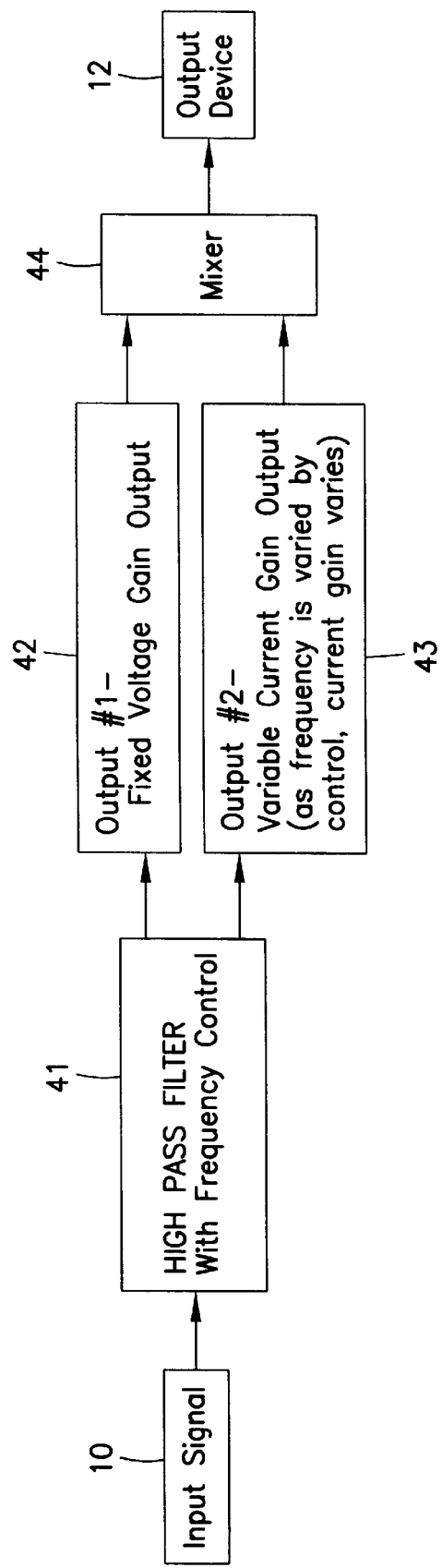
FIG. 6 is a block diagram of a level compensation apparatus where a single element of a potentiometer can change both frequency and gain constructed according to an embodiment of the present invention.
Figure 7:
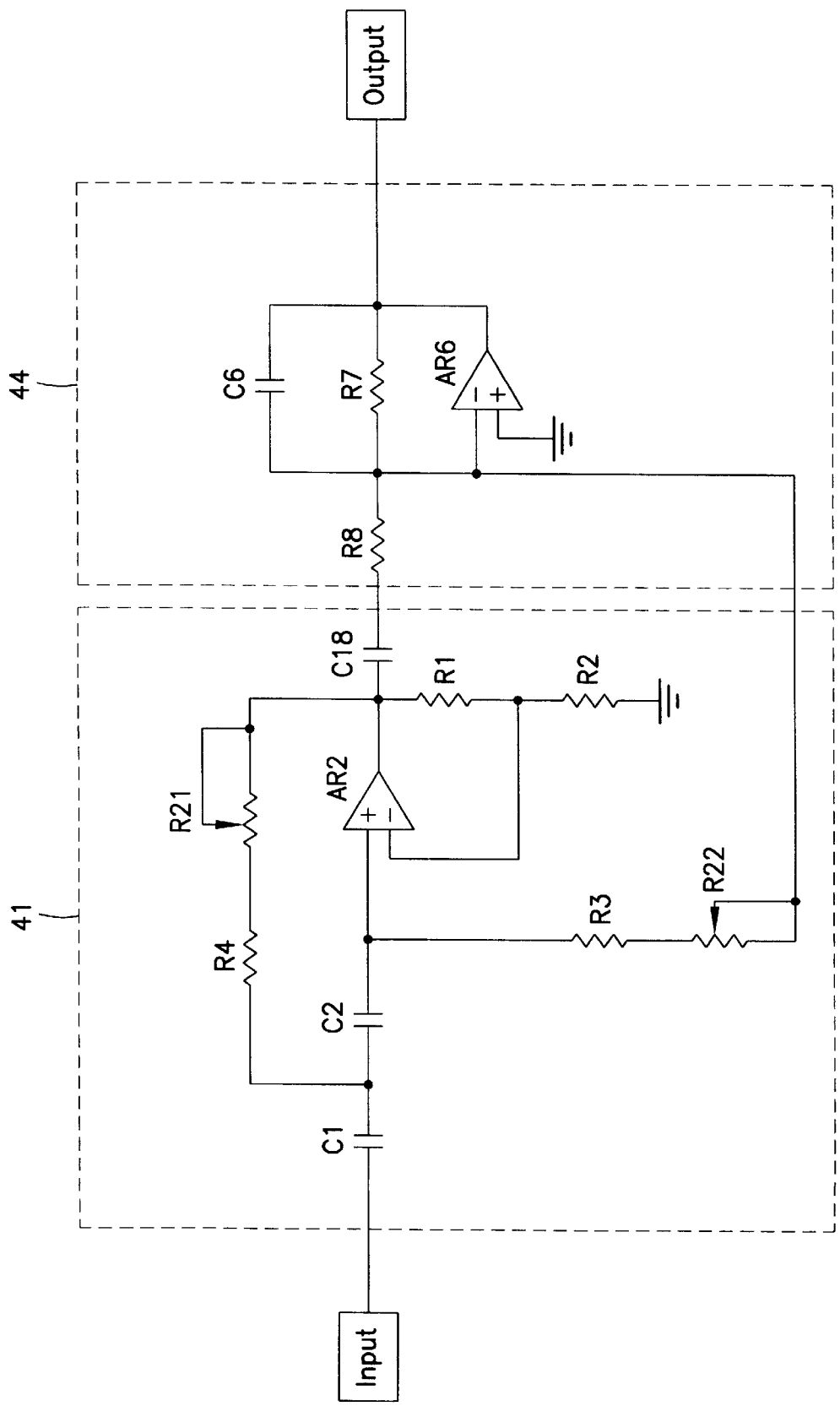
FIG. 7 is a detailed circuit diagram for the apparatus of FIG. 6.

A filter can be arranged so that a single element of a potentiometer can change both frequency and gain. FIG. 6 shows a functional diagram with a standard filter 41, namely a Sallen-Key second-order high pass filter, that has been manipulated to yield frequency-gain tracking of a dual potentiometer depicted by R21 and R22 in FIG. 7, element 41. Normally Output #2 (see FIG. 6, element 43) would be connected to ground. Instead, connecting R22 to current amplifier AR6 in FIG. 7, element 44 allows the same transfer function at Output #1 (see FIG. 6, element 43) and a second output whose current is inversely proportional to R3+R22. Note that the transfer functions of the two outputs are both high passes with poles at f=1/(2πRC) and Q=0.707, where R=R4+R21=R3+R22 and C=C1=C2. The high frequency output gain of the mixer is −R7/(R8+R). Accordingly, the frequency of the high pass filter and the gain can be controlled with a single control element of said potentiometer. Referring to FIG. 8, a digital version of level compensation is shown next to a known system. In the art, it is known to provide a user interface to select a function (e.g., set a high pass filter) and provide an input as to frequency (e.g., the cut-off frequency for the high pass filter). The filter coefficients that are necessary to implement the desired function are selected from memory based on the input frequency. The output then is the resulting adjustment of the filter frequency. According to an embodiment of the present invention, the memory is further used to store gain values that are selected based on the frequency input from the user. Accordingly, level compensation is performed based on the selected frequency as described in more detail above.

Aside from needing to separately compensate each control that causes a change in level, there are circumstances under which this solution will not be adequate. Under predictable circumstances (where combinations of sound source and equalizing type are consistent), the above process produces very good results. The more limited the type of source material, and the more limited the range/effect of the equalizing element, the easier it is to develop an empirically derived compensated processor. But the more varied the source, the more tests are needed, and eventually, test results will be contradicting.

The most complicated situation would be to design for all possible human listeners (acknowledging that each one is different as seen by the Fletcher-Munson curves, which are averages), for all possible sound sources (speech, music, sound effects, etc.,), with a knob that has a wide range (e.g., a frequency control with a range of 20–20 khz). This is actually impossible, because of how variations in the source interact with a given equalizer. For example, assume one designs a bass boost frequency knob that works well for a broad source like an orchestra, and assume that in the low range, the compensating circuit amplification level increases (this is likely because of the Fletcher-Munson effect). It is assumed that there is a place in the music where only a musical triangle is playing. As the equalizer knob is adjusted in the low region, it has no effect on the tone of the triangle, because the triangle has no low frequencies that can be boosted. We expect to hear no change at all, but the gain compensator is still adding level, so the triangle changes volume as we turn the knob back and forth. For a triangle (or any sound with no low frequencies), this knob has turned into a volume control, and is confusing to a user. Thus, a circuit that compensates based only on where the equalizer knob is set (as determined by any method, including the one above) won't work well in broadly different circumstances. For those circumstance, the first embodiment described above is preferred.

Figure 13:
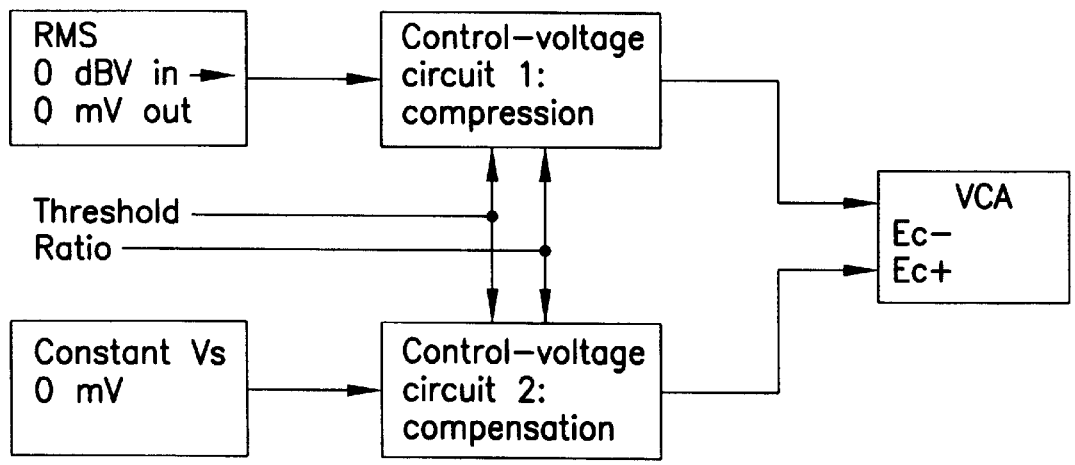
FIG. 13 is a block diagram of a third embodiment of the present invention.

A third embodiment of the present invention is shown in FIGS. 13–16 as a dynamic processing compensation circuit. A dynamic processor changes the gain of a signal to achieve any number of effects: limiting peaks to prevent overload, compressing the dynamic range of a signal, expanding the range, sustaining a note longer, etc. Since the total gain changes based on the input signal level, it is very difficult to compensate for adjustments in parameters using the source-adjusted compensation method described above. Such methods are likely to undo the work of the processor. Instead, according to an embodiment of the present invention, one can compensate for expected gain changes with the following procedure:

1. Assume a normalized listening level desired after processing. The simplest normal point is 0 dBV.
2. Since without compression at unity gain an input signal of 0 dBV yields an output of 0 dBV, any change in gain from compression of a 0 dBV input signal should be matched by an equal and opposite change of gain to maintain a 0 dBV output. For instance, if a reduction in dynamic range is desired from 90 dB to 60 dB, starting at −90 dBV, a compressor is used to steadily reduce gain as an input signal rises up to 0 dBV. But the output of a 0 dBV input would be −30 dBV. It is more likely that a range of −60 to 0 dBV is desired, not −90 to −30 dBV. So the gain should be increased by 30 dB.
3. The gain adjustment is shown in FIG. 13. Using a Voltage-Controlled Amplifier (VCA) with positive and negative control voltage inputs, a constant control voltage is supplied to one terminal that is equal to the control voltage expected at the other terminal with an input of 0 dBV. For instance, a 0 dBV input signal at certain parameter settings may produce +100 mV at the negative control port, reducing the gain. A +100 mV voltage at the positive control port cancels this reduction. Alternatively, equal and opposite control voltages may be combined at a single terminal for the same result.

To implement this method, identical circuitry is used to modify both the RMS output signal, and a constant voltage source that is equal to the RMS output at the normalized input level (0 dBV in this case). In this embodiment, dual potentiometers for threshold and ratio knobs can be used to simultaneously adjust both control-voltage circuits, so that the two control voltages change in tandem. Other circuits can be used to achieve the same functionality.

Figure 14:
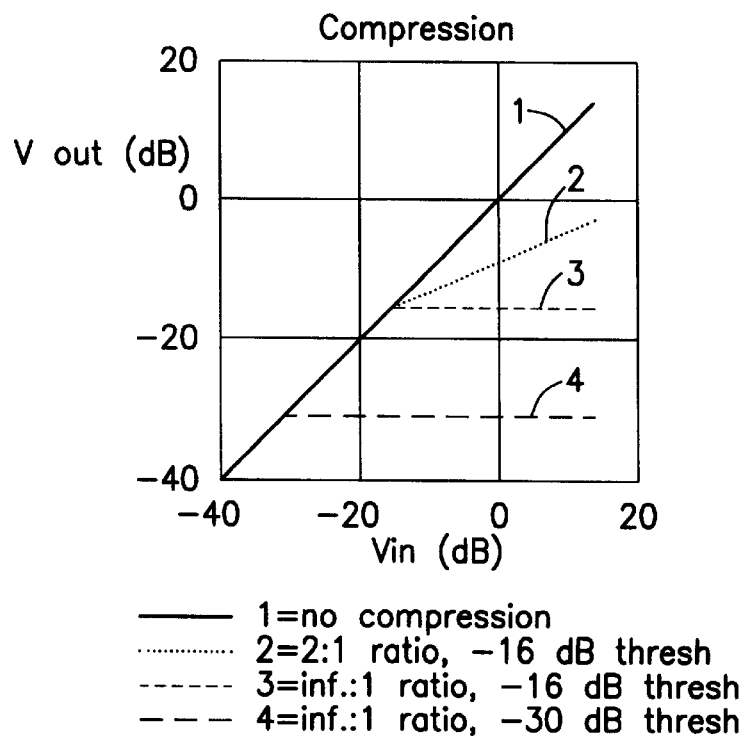
FIG. 14 is a graph showing the effects of compression as is known in the art.
Figure 15:
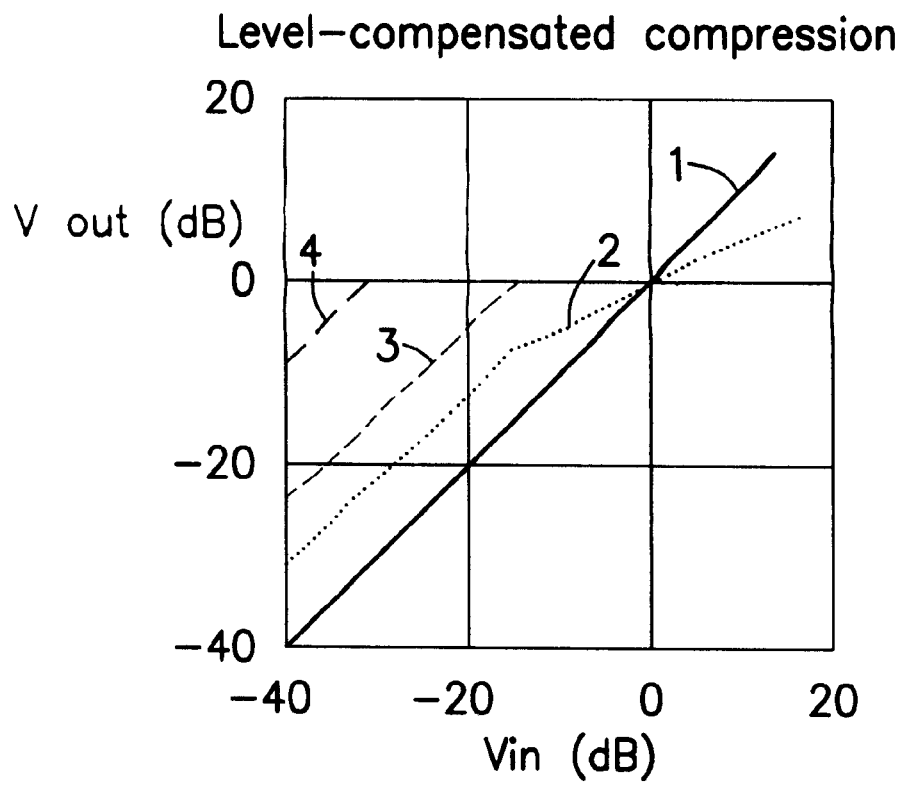
FIG. 15 is a graph showing the effects of compression with level-compensation according to an embodiment of the present invention.
Figure 15A:
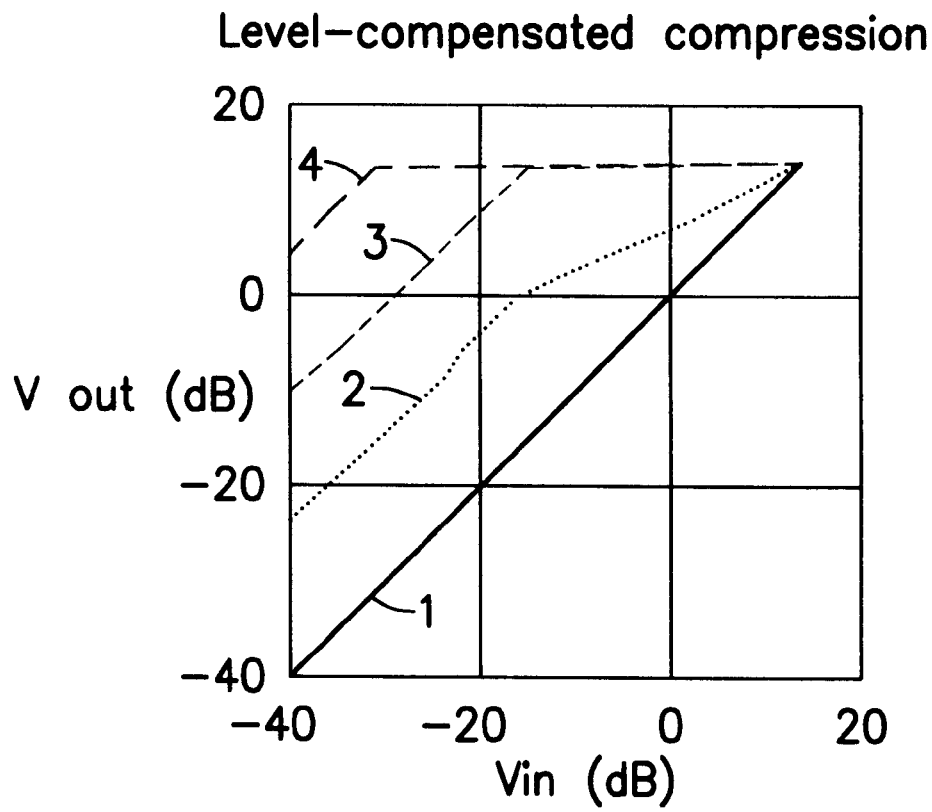
FIG. 15A is a graph similar to FIG. 15 normalized to a different level.
Figure 16:
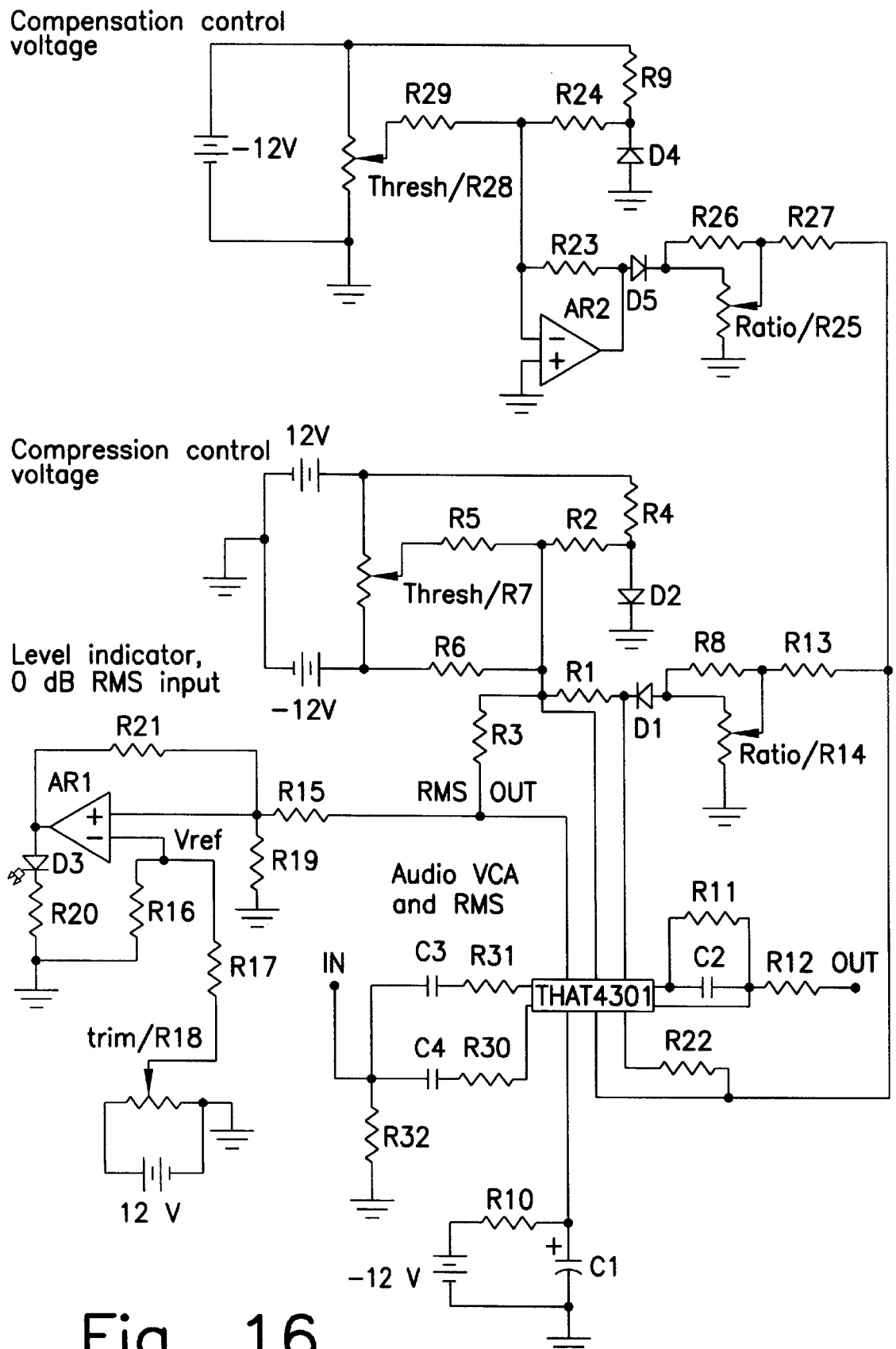
FIG. 16 is a detailed circuit diagram of a dynamic processor for implementing the third embodiment of the present invention.

Referring to FIG. 14, a graph of a typical compressor's transfer function Vin versus Vout is shown. Note how much the peak level is reduced for low thresholds and large ratios. In FIG. 15 a graph of a level-compensated compressor at various settings is shown, normalizing the level to 0 dBV (in FIG. 15A, the same effect is shown normalized to 14 dBV). For instance, a 2:1 ratio, −16 dBV threshold compression reduces the gain −8 dB at 0 dBV input. The gain is therefore compensated +8 dB. At ?:1, the gain must be compensated +16 dB. Note that normalizing at a level high in the dynamic range increases the volume of a bulk of the signal, which generally lies below 0 dBV. But unless the aim is to merely "shave off the top," this gain adjustment is usually desired. In FIG. 16, a detailed schematic of a dynamic processor using a THAT4301 dynamic processor chip is shown integrating an RMS converter and a log-based VCA.

The embodiments of the present invention compensate for level differences caused by changes in the signal processor. The compensator should only adjust level based on the processor's modification of the signal. To avoid false triggers of level compensation, a detection circuit or switch should freeze the level compensator from changing its modification when the signal processor is not being adjusted.

What is claimed is:

1. A level compensation system to compensate for a change in signal level by a signal processor from a first signal level for an input signal to a second signal level for a modified signal in at least one frequency band, the system comprising:

A comparison unit adapted to be coupled to an output of said signal processor and adapted to receive said input signal and said modified signal from said signal processor, said comparison unit adapted to determine a difference in signal level between said input signal and said modified signal; and A level compensation unit coupled to an output of said comparison unit and adapted to be coupled to an output of said signal processor, said level compensation unit adapted to modify the signal level of said modified signal based on said difference in signal level.

2. The level compensation system of claim 1 wherein said input signal is an audio signal.

3. The level compensation system of claim 2 further comprising:

A signal processor coupled to said comparison unit and said level compensation unit, wherein said signal processor includes at least one of an equalizer, vocoder, distortion effect component, chorus effect component, flanger effect component, ring modulator, wah-wah effect component, compressor, expander, tremelo component, vibrato component, reverberation component, and delay component.

4. A level compensation system to compensate for a change in signal level by a signal processor from a first signal level for an input signal to a second signal level for a modified signal in at least one frequency band, the system comprising:

A comparison unit adapted to receive said input signal; and a level compensation unit adapted to be coupled to an output of said signal processor and an output of said comparison unit, said level compensation unit adapted to modify the signal level of said modified signal based on the output of said comparison unit; and said comparison unit adapted to output a signal indicating a difference in signal level between the input signal and the signal output by said level compensation unit.

5. The level compensation system of claim 4 wherein said input signal is an audio signal.

6. The level compensation system of claim 5 further comprising:

A signal processor coupled to said comparison unit and said level compensation unit, wherein said signal processor includes at least one of an equalizer, vocoder, distortion effect component, chorus effect component, flanger effect component, ring modulator, wah-wah effect component, compressor, expander, tremelo component, vibrato component, reverberation component, and delay component.

7. The level compensation system of claim 4 wherein said comparison unit further comprises:

A first root-mean-squared converter adapted to receive said input signal;

A second root-mean-squared converter adapted to receive said modified signal; and A comparator coupled to said first and second root-mean-squared converters.

8. The level compensation system of claim 7 wherein said level compensation unit further comprises:

A circuit including a digitally controlled resistor having a first input coupled to said comparator and a second input adapted to receive said modified signal, said circuit adapted to modify the volume level of said modified signal based on an output of said comparator.

9. A method of performing level compensation to compensate for a change in signal level caused by signal processing on an input signal comprising:

Processing an input signal in a signal processor to create a modified signal where during said processing step the signal level of said input signal is changed by said signal processor;

Comparing a signal level of said input signal to a signal level of said modified signal to determine a difference in signal level; and Modifying the signal level of said modified signal based on said difference in signal level to compensate for a change in signal level caused by the signal processor.

10. The method of claim 9 wherein in said modifying step, the signal level of said modified signal is modified to match the signal level of said input signal.

11. A method of performing level compensation comprising:

(a) supplying an input signal to a signal processor;

(b) adjusting a control of said signal processor by a predetermined amount;

(c) comparing a level of said input signal and a level of a modified signal output by said signal processor;

(d) determining a difference value representing a difference in level between said input signal and said modified signal;

(e) repeating steps (a) to (d) for a plurality of input signals;

(f) calculating an expected difference in signal level caused by an adjustment of the control of said signal processor based on said difference values determined in step (d).

12. The method of claim 11 wherein step (b) includes adjusting said control a plurality of times.

13. The method of claim 12 further comprising:

(g) modifying the signal level of a modified signal based on the expected difference in signal level calculated in step (f).

14. A method of performing level compensation comprising:

(a) supplying an input signal to a dynamic signal processor, said dynamic signal processor adapted to change a gain of said input signal in dependence on a predetermined ratio when said input signal has a signal level that crosses a predetermined threshold;

(b) supplying an output control voltage signal from said dynamic signal processor to an amplifier which effects changes to the input signal's level;

(c) supplying a constant control voltage equal to an expected output control voltage signal from said dynamic signal processor of a normalized input signal based on settings of said predetermined ratio and said predetermined threshold; and (d) modifying said input signal in said amplifier based on a difference between said output control voltage and said constant control voltage.

15. A circuit for controlling gain and frequency modification of an input signal comprising:

a filter circuit adapted to receive said input signal and to modify a signal level of said input signal in at least one frequency range, where said frequency range is selected based on a control input; and a gain circuit adapted to receive said modified signal from said filter circuit, and a signal from said control input, said gain circuit adapted to modify the gain of said modified signal based on the signal from said control input.

16. The circuit of claim 15 wherein said control input selects a resistance value in each of said filter and gain circuits.

17. The circuit of claim 16 wherein said control input is part of a potentiometer.

18. The circuit of claim 17 wherein said control input is generated from a single control element of said potentiometer.

* * * * *